United States Patent [19]

Scheingold et al.

[11] 4,334,727
[45] Jun. 15, 1982

[54] CONNECTOR FOR A LEADLESS ELECTRONIC PACKAGE

[75] Inventors: William S. Scheingold, Palmyra; Frank C. Youngfleish, Harrisburg, both of Pa.

[73] Assignee: AMP Incorporated, Harrisburg, Pa.

[21] Appl. No.: 182,266

[22] Filed: Aug. 28, 1980

[51] Int. Cl.³ .............................................. H01R 13/22
[52] U.S. Cl. ............................ 339/17 CF; 339/176 M
[58] Field of Search ....... 339/17 CF, 176 M, 176 MP

[56] References Cited

U.S. PATENT DOCUMENTS

| | | | |
|---|---|---|---|
| 3,874,768 | 4/1975 | Cutchaw | 339/17 CF |
| 3,877,064 | 4/1975 | Scheingold et al. | 357/74 |
| 3,884,544 | 5/1975 | Lundergan et al. | 339/198 G |
| 3,907,394 | 9/1975 | Barnes | 339/65 |
| 4,026,014 | 5/1977 | Sugimoto et al. | 29/629 |
| 4,052,118 | 10/1977 | Scheingold et al. | 339/17 |

FOREIGN PATENT DOCUMENTS 2312915 12/1976 France .............................. 339/17 CF Primary Examiner—Joseph H. McGlynn
Attorney, Agent, or Firm—Allan B. Osborne

[57] ABSTRACT

The subject invention relates to a connector for electrically connecting a leadless electronic package to a printed circuit board. More particularly, the connector includes a frame-shape housing containing terminals having a circular contact section which engages the pads on the package. A clamp plate is also disclosed which secures the package and connector to the printed circuit board.

9 Claims, 4 Drawing Figures

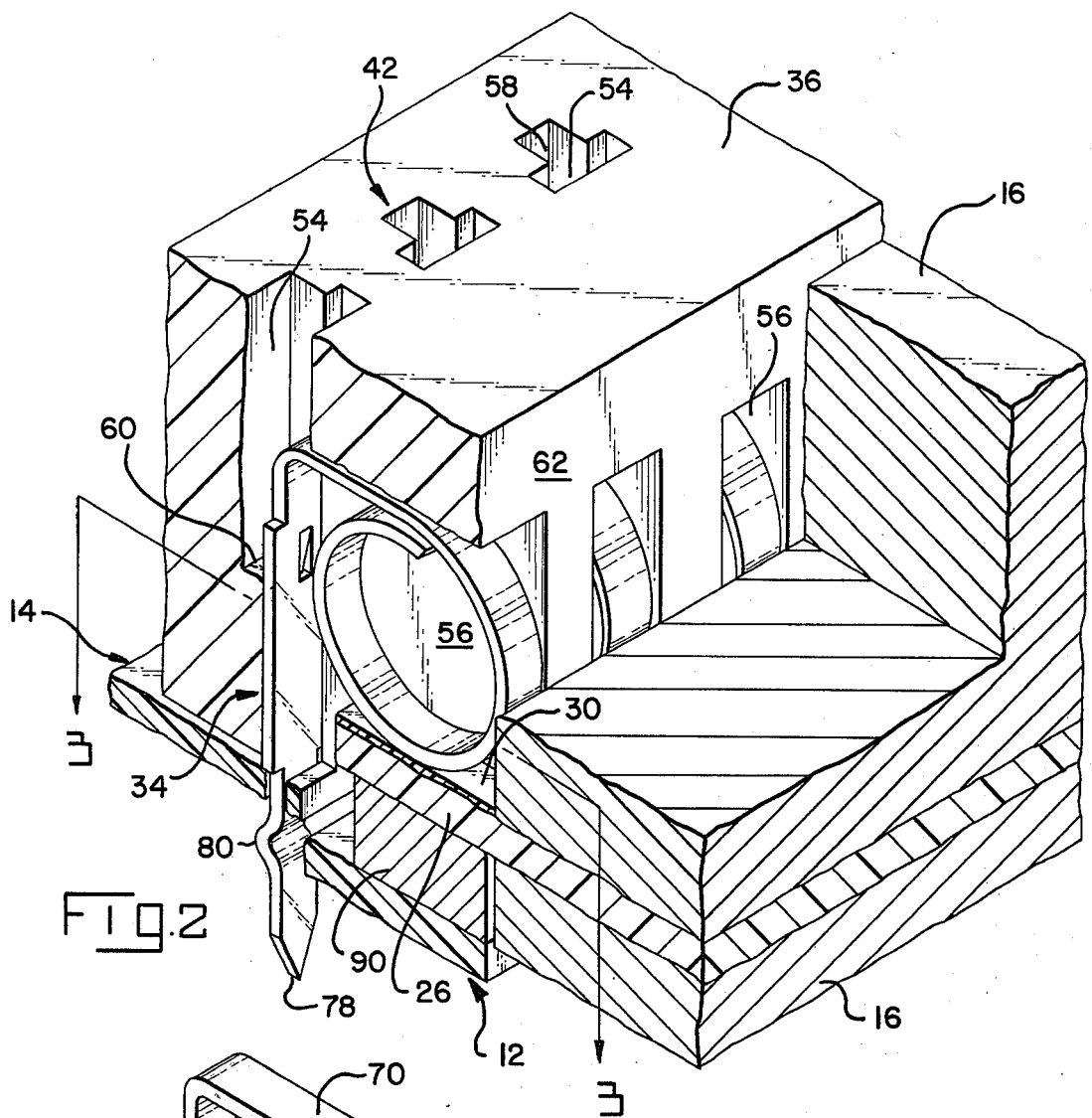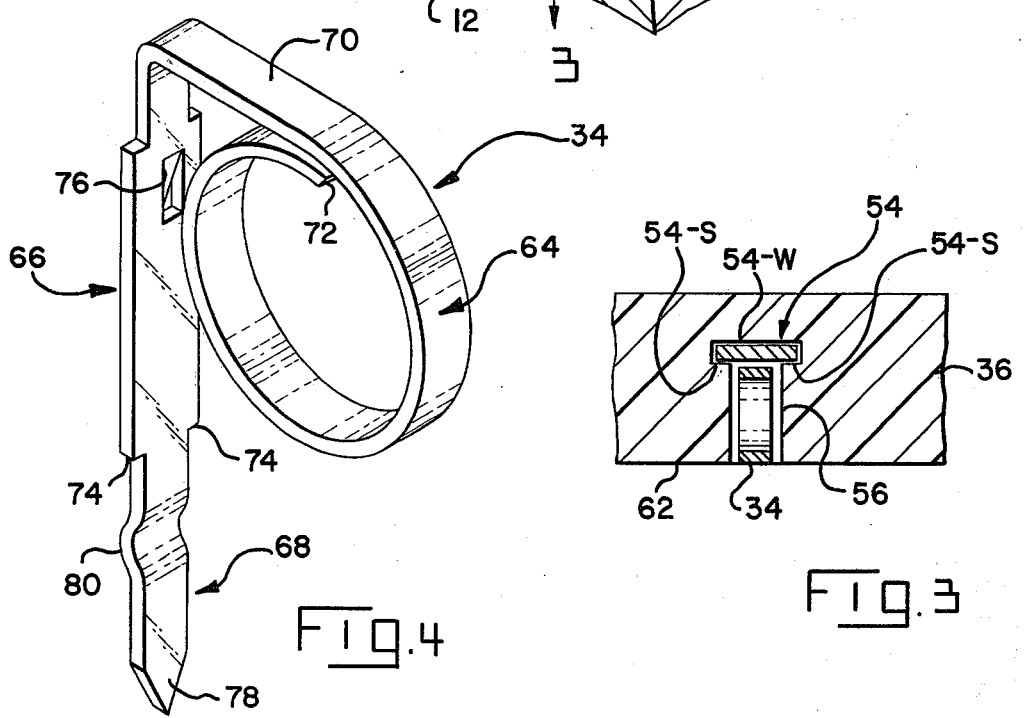

CONNECTOR FOR A LEADLESS ELECTRONIC PACKAGE

BACKGROUND OF THE INVENTION

1. The Field Of The Invention

This invention relates to the art of electrically connecting leadless electronic packages to a printed circuit board or the like. The vehicle generally employed is a housing of some specific structure in which are positioned a required number of terminals having a contact on one end for engaging a pad or circuit trace on the electronic package and a leg or pin on the other end for insertion into the circuit board. The housing further includes means for securing the electronic package therein so that the contacts between the terminals and pads are under a predetermined compressive force.

2. The Prior Art

U.S. Pat. Nos. 3,877,064 and 4,052,118 are two patents which disclose connectors for use in retaining leadless electronic packages and electrically connecting them to a printed circuit board. The connector disclosed in the first cited patent includes a frame structure having a number of cavities along each of the four sides. An S-shaped contact, positioned in each cavity has an upper end which contacts a pad on the leadless package which is positioned in a central opening defined by the frame structure. The lower end of the contact engages a trace on a printed circuit board. A bracket is bolted to the top of the frame to retain the electronic package.

U.S. Pat. No. 4,052,118 discloses a connector consisting of an elongated housing having a number of cavities along two, opposite sides and contact-bearing spring members positioned in the cavities. The spring members have a complex geometric shape adapted to exert compressive forces on the contact mating surfaces between the spring members, the leadless package and the printed circuit board. The elongated leadless electronic package fits into an opening between the two opposite sides and is retained therein by a pair of bolts which also secures the connector to the printed circuit board.

SUMMARY OF THE INVENTION

The subject invention includes a connector consisting of a housing of insulative material and a plurality of terminals positioned in cavities located along two, opposite side walls. The terminals are stamped and formed from flat metal stock. One end extends through the housing for insertion into plated-through holes in a printed circuit board. The other end of the terminal is formed into a circular contact section which engages pins or pads on an electronic package. The cavities in which the terminals are placed consist of a vertical shaft and a laterally and downwardly opened slot. The circular contact section occupies the slot and the remaining sections of the terminal occupy the vertical shaft.

The electronic package is inserted into the connector from below. The pads on the package abut up against the lower surface of the circular contact and are retained thereagainst by a clamp plate. The configuration of the circular contact section lends itself to exceptionally good deflection characteristics whereby a predetermined force is exerted against the pads under most temperature variations.

BRIEF DESCRIPTION OF THE DRAWINGS

FIG. 2 is a cut-away view of the assembly of the several components of FIG. 1;

FIG. 3 is a cross-sectional view across the lower half of a terminal-receiving cavity in the connector housing; and FIG. 4 is a large scale view of the terminal of the subject invention.

DESCRIPTION OF THE INVENTION

Figure 1:
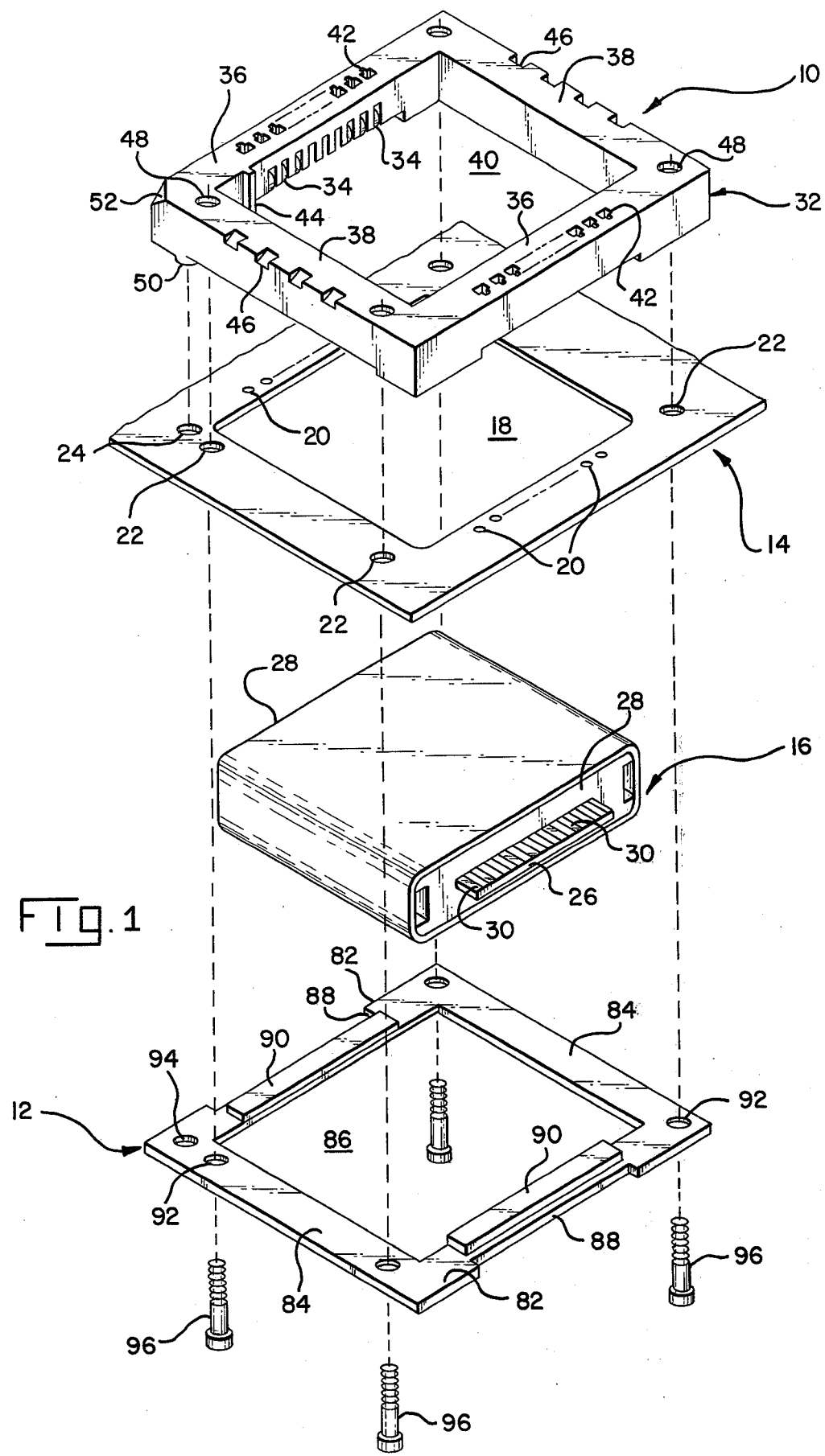
FIG. 1 is an exploded view showing the connector and clamp plate of the subject invention. Also shown are the printed circuit board and an electronic package with which the subject invention is used.

The connector and clamp plate of the subject invention are indicated generally by reference numerals 10 and 12 respectively in FIG. 1. The printed circuit board modified for use with the subject invention is indicated by reference numeral 14. The electronic package is indicated by reference numeral 16.

Of the four identified components shown in FIG. 1, printed circuit board 14 and electronic package 16 are not part of the subject invention and are now described only briefly for the purpose of aiding the more detailed description of the subject invention and the utility thereof.

A conventional printed circuit board 14 is constructed having an opening 18 and a given number of plated-through holes 20 adjacent to and along two opposing sides of the opening. Four screw receiving holes 22 are located in the board generally adjacent the corners of opening 18. A fifth, polarizing hole 24 is also located in the board.

Electronic package 16 has tabs 26 (only one is visible) extending outwardly from two opposite sides 28. Conductive pins or pads 30 on the tabs connect with an electronic device (not shown) within package 16. The length and width of the package is such that the package, including tabs 26, passes neatly through opening 18 in printed circuit board 14.

The electronic package such as the one described above and shown in the drawings is a magnetic bubble memory device which may be obtained from Intel Corp. of California. The connector of the present invention is not limited to magnetic bubble memory packages, however, and nothing herein should be so construed.

Connector 10 consists of a housing 32 and a given number of terminals 34.

Housing 32 is preferably molded from a high temperature plastic. One such plastic is marketed under the tradename RYTON R-4 by Philips Petroleum Co. The housing is a frame structure with two opposing first walls 36 and two opposing second walls 38, said walls defining a central opening 40. The opening between the two first walls 36 is only slightly larger than the length of package 16 between opposing sides 28; i.e., excluding tabs 26.

A given number of terminal-receiving cavities 42 are located in and along the two first walls 36. Orientation rib 44 is located on one of those walls also.

A number of notches 46 are provided in the top of second walls 38. These notches disrupt streamlined air flow, thus causing such to become turbulent and thereby increase the ability of the air flow to dissipate heat generated by magnetic bubble memory package 16 during operation.

Holes 48 which extend through housing 32 have therein threaded inserts. These holes are positioned adjacent the corners of the housing. Polarizing peg 50 is located in a corner on the underside of the housing. Beveled outside corner 52 on the housing marks the corner having the peg.

The structure of cavities 42 can best be seen in FIG. 2. With reference to the drawing therein, the cavities consist of two interconnected parts: vertical shaft 54 and slot 56.

Vertical shafts 54 are narrow in width and long in length, the latter dimension being parallel to the length of the wall. The shaft extends completely through the housing vertically but as shown in the drawings, only the lower approximate two-thirds is used with respect to terminal 34. The top one-third or so is a molding expediency well known in that art. The size of the shaft per se is only slightly greater than the retention section on the terminal. Probe openings 58, located in the upper half of the first walls, are open to the vertical shaft to provide access to terminals 34. The openings and shaft combine to create a T-shape when viewed from above. The floor of the probe opening, located about halfway down in the wall and indicated by reference numeral 60, provides a shoulder against which a lance on terminal 34 lodges.

Slots 56 are located in the lower, inside portion of the first walls and open out on to the inside surface 62 of the walls; i.e., into central opening 40: on to the underside or base of the walls back to shaft 54 and also in to shaft 54 itself. The slots extend upwardly for about two-thirds of the wall height. Above floor 60 a cross-sectional view (not shown) of the probe opening, shaft and slot resembles a cross opened at one end. An instaneous sectional view below floor 60 taken along line 3—3 of FIG. 2, and shown in FIG. 3, shows that shaft 54 and slot 56 combine to form a T-shape. In the three vertical sections of shaft 54, shaft and probe opening 58, shaft and slot 56, shaft and probe opening and slot, vertical wall and vertical shoulders combine to confine terminal 34 against horizontal movement. One such set of restrains are shown in FIG. 3 and indicated by reference numeral 54-W; i.e., vertical wall, and 54-S; i.e., vertical shoulders.

Terminals 34 are preferably stamped and formed from flat stock and in a continuous strip. The preferred material is beryllium copper.

FIG. 4 shows a terminal apart from the housing for clarity. The terminal has a circular contact section 64, retention part 66 and pin part 68. The latter two parts comprise the vertical section of the terminal. The contact section on the upper portion of the terminal begins with a ninety degree bend. Directly outwardly from the bend is a flat portion 70. The remaining length of the upper portion of the terminal has been bent down and back around so that free end 72 is under flat portion 70; i.e., a 360 degree bend. This provides a circular contact section which is in the same vertical plane as the vertical section of the terminal and which has good load deflection characteristics.

Retention part 66 has a width slightly less than the length of shaft 54. The width provides downwardly facing shoulders 74 which limits the insertion of pin part 68 into printed circuit board 14. Lance 76, struck from the retention part near its juncture with the circular contact section, projects obliquely downwardly on the side of the terminal opposite circular contact section 64.

Pin part 68 has a beveled tip 78 and a jog 80 between the tip and downwardly facing shoulders 74.

Terminals 34 are loaded into cavities 42 from below. Between the base of the wall and floor 60, lance 76 is pressed back into the retention part. As soon as the floor is passed the lance springs out over the floor so that the terminal cannot move down without depressing the lance through probe opening 58 with a suitable tool (not shown). As shown in FIG. 2, the flat portion 70 on the circular contact section 64 bears against the downwardly facing floor of slot 56 while the circular contact section generally fills the slot and extends below it slightly.

Clamp plate 12, shown in FIG. 1, is a four sided frame structure having two opposing first sides 82 and two opposing second sides 84. The sides define opening 86 thereinbetween. The plate is made from a non-magnetic metal and coated with an epoxy.

First sides 82 have an inwardly directed, recessed section 88 along the edge. A support bar 90 of insulative material, such as phenolic, is fixed to the upper surface of sides 82 along the edge of the recessed section.

Plate 12 has four holes 92 located adjacent the corners. A fifth polarizing hole 94 is also located in the plate. As indicated by the various dashed lines in FIG. 1, holes 92-94 in the plate, holes 22-24 in printed circuit board 14 and holes 48-peg 50 in and on housing 32 are all on the same dimensional pattern so that the four components can be assembled in a single orientation only. Screws 96 secure them together.

With reference to FIGS. 1 and 2, the method of assembling the four components begins with mounting connector 10 onto printed circuit board 14. The connector is properly orientated with peg 50 being received in hole 24 on the board. The pin parts 68 on terminals 34 are inserted into plated-through holes 20 on board 14 and are wave soldered therein. Jogs 80 on the pin sections, which are just below holes 20, prevent the connector from floating up off the board during the wave soldering operation. After the board and attached connector are cleaned subsequent to the soldering step, electronic package 16 is pushed up from below through opening 18 in board 14 and opening 40 in connector 10 until tabs 26 and pads 30 thereon abut the lower surfaces of circular contact sections 34. Proper orientation is assured by rib 44 on one first wall 36 entering a corresponding slot (not shown) on electronic package 16. Thereafter clamp plate 12 is brought up from below and screws 96 passed through holes 92-22 and threaded into the threaded inserts in holes 48 in connector 10. Proper orientation of plate 12 is obtained with peg 50 being received in hole 94.

The assembly is shown in FIG. 2. Note that support bar 90 is bearing against tab 26 to maintain pressure between pads 30 and circular contact sections 64. The contact sections, confined between the pads and slot floor, are slightly loaded by the screws joining plate 12 to connector 10. Accordingly, the circular contact sections can contract or expand under varying thermo conditions without degradation to the electrical contact with the pads. Also, the contact section loading provides a wiping action on the pads to enhance electrical contact.

The present invention may be subject to many modifications and changes without departing from the spirit or essential characteristics thereof. The present embodiments should be considered in all respects as illustrative and not restrictive of the scope of the invention.

What is claimed is:

1. A connector for an electronic package of the type having spaced conductive pads on tabs projecting outwardly from two opposing sides, said connector comprising:
   a. a frame-shaped housing having four spaced apart walls joined at the ends thereof to define the frame-shape and further to define a central opening therebetween with the distance between two opposing walls being approximately equal to the dimension of the electronic package between the outwardly projecting tabs, further, said two opposing walls having terminal-receiving cavities spaced along therein, said cavities having a vertical slot located in the lower portion of the walls and opening downwardly therefrom, said housing being of an insulating material; and
   b. a number of conductive terminals having a circular contact section and connecting means extending from and adapted for connecting the circular contact section to a printed circuit board, said terminals being positioned in the cavities with the circular contact sections being in the vertical slots and extending downwardly therefrom so that upon an electronic package being inserted into the central opening from below, the circular contact sections contact the pads on the tabs which extend below the two opposing walls.

2. The connector of claim 1 wherein said terminal-receiving cavities have a vertical shaft behind and in communication with the vertical slot and the connecting means on the terminals including a vertical section connected to and located behind the circular contact section and in the same vertical plane therewith, said vertical sections being received in the vertical shafts of said cavities with a lower part of the vertical section extending below the housing for insertion into a hole in a printed circuit board.

3. The connector of claim 2 further including probe openings extending into the two opposing walls and intersecting the cavities, said probe openings providing an upwardly facing floor positioned normal and open to the vertical shafts, said terminals further having a lance struck from and attached to the vertical section, said lance extending obliquely downwardly so that upon positioning a terminal in a cavity, said lance abuts the floor and prevents withdrawal of the terminal.

4. The connector of claim 2 wherein the lower part of the vertical section of the terminals include a jog for retaining the terminals in holes in a printed circuit board.

5. A method of making the terminals of the connector of claim 2 which comprises the steps of:
   a. stamping out from flat stock a predetermined shape comprising a contact section and a vertical section;
   b. bending the contact section ninety degrees so that it extends perpendicular to the vertical section; and
   c. curving the end of the contact section down and back around 360 degrees forming the circular contact section which is in front of and lies in the same plane as the vertical section.

6. A connector for an electronic package of the type having spaced conductive pads on tabs projecting outwardly from two opposing sides, said connector comprising:
   a. a frame-shaped housing having four spaced apart walls joined at the ends thereof to define the frame-shape and further to define a central opening therebetween with the distance between two opposing walls being approximately equal to the dimension of the electronic package between the outwardly projecting tabs, further, said two opposing walls having terminal-receiving cavities spaced along therein, said cavities having a vertical shaft and a connecting vertical slot, said slot being in the lower, inside portion of the walls and opening downwardly therefrom, said housing being of an insulative material; and
   b. a number of conductive terminals having a vertical section and a circular contact section, the latter section extending forwardly of the vertical section and lying in the same vertical plane therewith, said terminals being positioned in the cavities with the vertical section being in the vertical shaft and extending below the housing for connection to a printed circuit board and the circular contact section being in the vertical slot and extending downwardly therefrom, so that upon the electronic package being inserted into the central opening from below, the circular contact sections contact the pads on the tabs which underlie the two opposing walls.

7. A method of making the terminals of the connector of claim 6 which comprises the steps of:
   a. stamping out an elongated strip of predetermined shape from flat stock;
   b. bending an upper portion of the strip ninety degrees so it extends normally to the lower portion; and
   c. curving the end of the upper portion down and back around forming the circular contact section.

8. The connector of claims 1, 2, 3, 4 or 6 further including means for retaining the electronic package in the central opening of the housing.

9. The connector of claim 8 wherein the means includes a flat plate having a central opening of the same dimensions as the central opening in the connector housings and a support bar of insulative material on each of the two opposing sides of the central opening and means for attaching the plate to the connector housing so that the support bars bear against the underside of the tabs on the electronic package.

* * * * *